(12) United States Patent
Kim et al.

(10) Patent No.: US 9,105,234 B2
(45) Date of Patent: Aug. 11, 2015

(54) ARRAY SUBSTRATE ROW DRIVING UNIT, ARRAY SUBSTRATE ROW DRIVING CIRCUIT AND DISPLAY DEVICE

(71) Applicant: BOE TECHNOLOGY GROUP CO., LTD., Beijing (CN)

(72) Inventors: Tae Gyu Kim, Beijing (CN); Ying Wang, Beijing (CN); Pil Seok Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 120 days.

(21) Appl. No.: 13/995,702

(22) PCT Filed: Dec. 14, 2012

(86) PCT No.: PCT/CN2012/086706
§ 371 (c)(1),
(2) Date: Jun. 19, 2013

(87) PCT Pub. No.: WO2013/127231
PCT Pub. Date: Sep. 6, 2013

(65) Prior Publication Data
US 2014/0071114 A1    Mar. 13, 2014

(30) Foreign Application Priority Data
Feb. 29, 2012  (CN) .......................... 2012 1 0050062

(51) Int. Cl.
*G06F 3/038* (2013.01)
*G09G 5/00* (2006.01)
*G09G 3/32* (2006.01)
*G11C 19/28* (2006.01)

(52) U.S. Cl.
CPC ............ *G09G 3/3225* (2013.01); *G09G 3/3266* (2013.01); *G11C 19/28* (2013.01); *G09G 2300/0861* (2013.01)

(58) Field of Classification Search
None
See application file for complete search history.

(56) References Cited

U.S. PATENT DOCUMENTS

| 2006/0001637 | A1 | 1/2006 | Pak et al. |
| 2006/0164376 | A1 | 7/2006 | Moon |
| 2008/0198104 | A1 | 8/2008 | Yamashita et al. |

(Continued)

FOREIGN PATENT DOCUMENTS

| CN | 101251977 A | 8/2008 |
| CN | 101625841 A | 1/2010 |

(Continued)

OTHER PUBLICATIONS

First Chinese Office Action dated Feb. 26, 2014; Appln. No. 201210050062.4.

(Continued)

*Primary Examiner* — Nicholas Lee
(74) *Attorney, Agent, or Firm* — Ladas & Parry LLP

(57) ABSTRACT

An array substrate row driving unit, an array substrate row driving circuit and a display device. The array substrate row driving unit comprises an emission control module (12) and an gate driving module (11) for generating an gate driving signal. The emission control module (12), connected to the output for the gate driving signal of the gate driving module (11), for generating an emission control signal for controlling the switching of OLED under control of the gate driving signal. The gate driving signal having an opposite phase to that of the emission control signal.

13 Claims, 4 Drawing Sheets

(56) References Cited

U.S. PATENT DOCUMENTS

2011/0012823 A1    1/2011  Tsai et al.
2011/0274236 A1*  11/2011  Tobita .............................. 377/79
2011/0316892 A1    12/2011  Sung et al.

FOREIGN PATENT DOCUMENTS

| | | |
|---|---|---|
| CN | 102201194 A | 9/2011 |
| CN | 102298900 A | 12/2011 |
| CN | 102708795 A | 10/2012 |
| EP | 1843317 A1 | 10/2007 |

OTHER PUBLICATIONS

International Search Report dated Mar. 21, 2013; PCT/CN2012/086706.
International Preliminary Report on Patentability dated Sep. 2, 2014; PCT/CN2012/086706.
Korean Office Action dated Apr. 29, 2014; Appln. No. 10-2013-7010106.
Korean Notice of Allowance Appln. No. 10-2013-7010106; Dated Nov. 25, 2014.

* cited by examiner

ARRAY SUBSTRATE ROW DRIVING UNIT, ARRAY SUBSTRATE ROW DRIVING CIRCUIT AND DISPLAY DEVICE

FIELD OF THE INVENTION

The present invention relates to the field of organic light-emitting display, and more particularly relates to an array substrate row driving unit, array substrate row driving circuit and a display device.

BACKGROUND

The organic light-emitting diode (OLED) has been increasingly used in high-performance display due to its advantages of high brightness, wide viewing angle and rapid response speed, etc. With the increase of its display size, the conventional passive matrix organic light-emitting display (Passive Matrix OLED) requires a shorter driving time of a single pixel, which needs to increase the transient current, thus increasing the power consumption. At the same time, the application of a large current will cause the voltage drop on the ITO (pixel electrode) line to be excessively large and the working voltage of OLED to be too high, thereby reducing its efficiency. The active matrix organic light-emitting display (Active Matrix OLED) inputs OLED current by progressive scanning via switch transistors, which can solve these problems very well.

The array substrate row driving circuit (Gate on Array) integrates the gate switch circuit on an array substrate, thus achieving a high-degree integration of the driving circuit, reducing costs both by saving material and reducing process steps.

As to AMOLED (active matrix organic light-emitting diode) display, not only the generation of a row strobe signal is required to control the ON/OFF state of the pixels connected to the gate line, but also a control over the ON/OFF state of the organic light-emitting display diode is required. The state control signal of the organic light-emitting display diodes for an AMOLED display backplane constituted of the P-type transistors is a positive level signal to ensure that an OLED component is in an OFF state during the process of writing display data into the pixel units, while after the display data have been written into the pixel units, the OLED component turns on and emits light so as to ensure that the displaying image will not flicker due to the unstable state of the pixel circuit when the data are being written.

SUMMARY

An embodiment of the invention provides an array substrate row driving unit, array substrate line driving circuit and a display device, which may ensure that an OLED component is in an OFF state during the process of writing the display data into the pixel units, while after the display data have been written into the pixel units, the OLED component turns on and omits light so as to ensure that the displaying image will not flicker due to the unstable state of the pixel circuit when the data are being written.

To achieve the above, an embodiment of the invention provides an array substrate row driving unit comprising a gate driving module for generating a gate driving signal, and the array substrate row driving unit further comprises an emission control module;

the emission control module, being connected to the output for the gate driving signal of the gate driving module, is used for generating an emission control signal for controlling the switching of OLED under control of the gate driving signal, the gate driving signal having an opposite phase to that of the emission control signal.

According to an embodiment of the invention, the gate driving module comprises a first thin film transistor, a second thin film transistor, a third thin film transistor and a first bootstrap capacitor, wherein, the first thin film transistor, having a gate connected to the output for the gate driving signal of the previous-stage array substrate row driving unit, a source connected to a drain of the second thin film transistor, and a drain connected to a first output level of the driving power supply;

the second thin film transistor, having a gate connected to the output for the gate driving signal of the next-stage array substrate row driving unit, and a source connected to a second output level of the driving power supply;

the third thin film transistor, having a gate connected to the source of the first thin film transistor, a source connected to the drain of the fourth thin film transistor, and a drain connected to the input for a first clock signal;

the fourth thin film transistor, having a gate connected to the input of a second clock signal, and a source connected to the second output level of the driving power supply;

the first bootstrap capacitor being connected between the gate and source of the third thin film transistor;

the gate of the first thin film transistor being an input, and the source of the third thin film transistor being the output for the present-stage gate driving signal.

When implemented, the emission control module comprises a fifth thin film transistor, a sixth fifth thin film transistor, a seventh thin film transistor, an eighth thin film transistor and a second bootstrap capacitor, wherein, the fifth thin film transistor, having a gate connected to the output for the gate driving signal of next-stage array substrate row driving unit a source connected to the drain of the sixth thin film transistor, and a drain connected to the first output level of the driving power supply;

the sixth thin film transistor, having a gate connected to the drain of the fourth thin film transistor, and a source connected to the second output level of the driving power supply;

the seventh thin film transistor, having a gate connected to the source of the fifth thin film transistor, a source connected to the drain of the eighth thin film transistor, and a drain connected to the first output level of the driving power supply;

the eighth thin film transistor, having gate connected to the gate of the sixth thin film transistor, and a source connected to the second output level of the driving power supply;

the second bootstrap capacitor being connected between the gate and source of the seventh thin film transistor;

the source of the seventh thin film transistor being the output for the emission control signal.

According to an embodiment of the present invention, the first level output of the driving power supply is a low-level output;

the second level output of the driving power supply is a high-level output;

the first thin film transistor, the second thin film transistor, the third thin film transistor and the fourth thin film transistor are p-type thin film transistors.

According to an embodiment of the present invention, the first level output of the driving power supply is a low-level output;

the second level output of the driving power supply is a high-level output;

the fifth thin film transistor, the sixth thin film transistor, the seventh thin film transistor and the eighth thin film transistor are p-type thin film transistors.

According to an embodiment of the present invention, the first level output of the driving power supply is a high-level output;

the second level output of the driving power supply is a low-level output;

the first thin film transistor, the second thin film transistor, the third thin film transistor and the fourth thin film transistor are n-type thin film transistors.

According to an embodiment of the present invention, the first level output of the driving power supply is a high-level output;

the second level output of the driving power supply is a low-level output;

the fifth thin film transistor, the sixth thin film transistor, the seventh thin film transistor and the eighth thin film transistor are n-type thin film transistors.

An embodiment of the present invention also provides an array substrate row driving circuit, including multi-stages aforementioned array substrate row driving units manufactured on the array substrate of a liquid crystal through an array film-forming process.

Except for the first-stage array substrate row driving unit, the input of each stage of the array substrate row driving units is connected to the output for the gate driving signal of the previous-stage array substrate row driving unit.

Except for the final-stage array substrate row driving unit, the reset terminal of each stage of the array substrate row driving units is connected to the output for the gate driving signal of the next-stage array substrate row driving unit adjacent to the array substrate row driving unit of the stage.

An embodiment of the present invention also provides a display device comprising the aforementioned array substrate row driving circuit.

Compared with the prior art, the array substrate row driving unit, the array substrate row driving circuit and the display device according to the embodiments of present invention generate an gate driving signal, and at the same time also generate an emission control signal with an opposite phase to that of the gate driving signal, so that OLED component is in an OFF state in the process of writing the display data into the pixel unit, while OLED component turns on and omits light after the display data have been written into the pixel units, so as to ensure that the displaying image will not flicker due to the unstable state of the pixel circuit when the data are being written.

DETAILED DESCRIPTION

Compared to AMLCD (Active Matrix Liquid Crystal Display), AMOLED (active matrix organic light-emitting diode) is usually implemented in a low-temperature polysilicon circuit with greater mobility due to its need for an increased driving current. To compensate for the threshold voltage drift problem present in the polysilicon TFT (thin film transistor), the pixel circuit of the AMOLED often requires a corresponding compensative structure, so the structure of the pixel circuit of the AMOLED is more complex, and correspondingly needs to occupy a larger circuit layout area.

An embodiment of the present invention provides an array substrate row driving circuit, which has a simple structure and stable performance, for the active matrix organic light-emitting display, and the array substrate row driving circuit comprises a plurality of cascading array substrate row driving units manufactured on the array substrate of a liquid crystal through an array film-forming process. Each array substrate row driving unit contains 8 thin film transistors and 2 capacitors. The array substrate row driving unit is divided into two stages, a first stage being used for generating a the conventional gate line strobe signal, a second stage being used for accordingly generating a control signal to control the switching of the organic light-emitting diode. The array substrate row driving circuit according to an embodiment of present invention has a simple and compact structure, which reduces the circuit layout area, and is the best choice to achieve high resolution AMOLED display.

Figure 1:
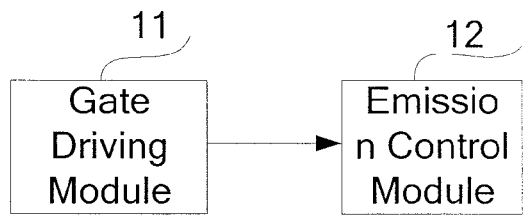
FIG. 1 is a structure diagram of an array substrate row driving unit of a first embodiment of the present invention.

As shown in FIG. 1, the array substrate row driving unit according to a first embodiment of present invention includes a gate driving module 11 and an emission control module 12, wherein, the gate driving module 11 being connected to the emission control module 12, for generating a gate driving signal;

the emission control module being is used for generating an emission control signal for controlling the switching of OLED under control of the gate driving signal, the gate driving signal having an opposite phase to that of the emission control signal.

In the array substrate row driving unit according to the first embodiment of the present invention, the emission control module 12 generates an emission control signal that has an opposite phase to that of the gate drive signal, so that OLED component is in an OFF state during the process of writing the display data into the pixel units, while OLED component turns on and omits light after the display data have been written into the pixel units, therefore ensuring that the displaying image will not flicker due to the unstable state of the pixel circuit when the data is written.

Figure 2:
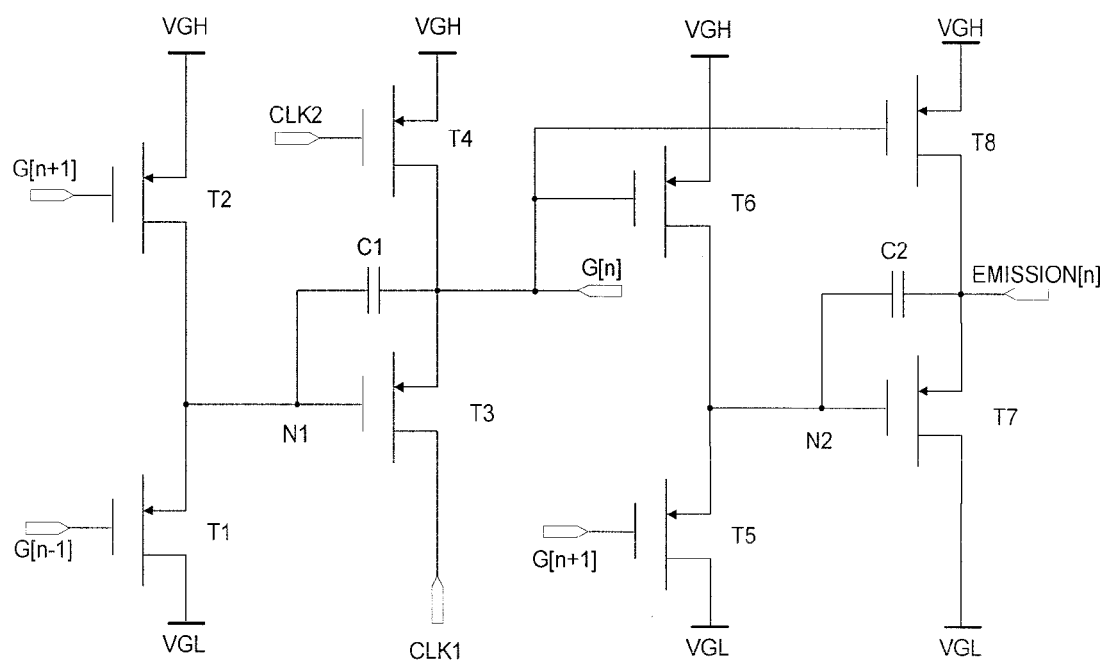
FIG. 2 is a circuit diagram of an array substrate row driving unit of a second embodiment of the present invention.

As shown in FIG. 2, it shows a circuit diagram of an array substrate row driving unit according to a second embodiment of the present invention. The array substrate row driving unit according to the second embodiment of the present invention is based on that of the first embodiment of the present invention. In the array substrate row driving unit according to the second embodiment of the present invention, the gate driving module including a first thin film transistor T1, a second thin film transistor T2, a third thin film transistor T3, a fourth thin film transistor T4 and a first bootstrap capacitor C1, wherein, the first thin film transistor T1, having a gate connected to the output for the gate driving signal of the previous-stage array substrate row driving unit, a source connected to a drain of the second thin film transistor T2, and a drain connected to the low-level output of the driving power supply;

the second thin film transistor T2, having gate connected to the output for the gate driving signal of next-stage array substrate row driving unit, and a source connected to the high-level output of the driving power supply;

the third thin film transistor T3, having a gate connected to the source of the first thin film transistor T1, a source connected to a drain of the fourth thin film transistor T4, and a drain connected to the input for a first clock signal;

the fourth thin film transistor T4, having a gate connected to the input for a second clock signal, and a source connected to the high-level output of the driving power supply;

the first bootstrap capacitor C1 being connected between the gate and source of the third thin film transistor T3;

the first thin film transistor T1, the second thin film transistor T2, the third thin film transistor T3 and the fourth thin film transistor T4 being p-type thin film transistors.

the emission control module comprising a fifth thin film transistor T5, a sixth fifth thin film transistor T6, a seventh thin film transistor T7, an eighth thin film transistor T8 and a second bootstrap capacitor C2, wherein, the fifth thin film transistor T5, having a gate connected to the output for the gate driving signal of next-stage array substrate row driving unit, a source connected to the drain of the sixth thin film transistor T6, and a drain connected to the low-level output of the driving power supply;

the sixth thin film transistor T6, having a gate connected to the drain of the fourth thin film transistor T4, and a source connected to the high-level output of the driving power supply;

the seventh thin film transistor T7, having a gate connected to the source of the fifth thin film transistor T5, a source connected to a drain of the eighth thin film transistor T8, and a drain connected to the low-level output of the driving power supply;

the eighth thin film transistor T8, having a gate connected to the gate of the sixth thin film transistor T6, and a source connected to the high-level output of the driving power supply;

the second bootstrap capacitor C2 being connected between the gate and source of the seventh thin film transistor T7;

the fifth thin film transistor T5, the sixth thin film transistor T6, the seventh thin film transistor T7 and the eighth thin film transistor T8 being p-type thin film transistors;

the gate of the first thin film transistor T1 being the input of the array substrate row driving unit according to the second embodiment of present invention, the gate of the second thin film transistor T2 being the reset terminal of the array substrate row driving unit according to the second embodiment of present invention, the source of the third thin film transistor T3 being the output for the gate driving signal of the array substrate row driving unit according to the second embodiment of present invention, the source of the seventh thin film transistor T7 being an output for the emission control signal of the array substrate row driving unit according to the second embodiment of present invention.

Wherein output voltage of the low-level output of the driving power supply is VGL, and output voltage of the high-level output of the driving power supply is VGH. A first clock signal CLK1 is input into the first clock signal input, and a second clock signal CLK2 is input into the second clock signal input. The output signal of the output for the gate driving signal of the previous-stage array substrate row driving unit is G[n−1], that of the present-stage array substrate row driving unit is G[n], and that of the next-stage array substrate row driving unit is G[n+1]. The output signal of the output for the emission control signal of the present-stage array substrate row driving unit is EMISSION[n]. The point N1 is a node connected to the gate of the third thin film transistor T3, and the point N2 is a node connected to the gate of the seventh thin film transistor T7.

The array substrate row driving unit according to the second embodiment of the present invention is controlled by the first clock signal CLK1 and the second clock signal CLK2. The output signal of the output for the gate driving signal of the previous-stage array substrate row driving unit G[n−1] serves as the input signal of the present-stage array substrate row driving unit, and the output signal of the output for the gate driving signal of the next-stage array substrate row driving unit G[n+1] serves as the reset signal of the present-stage array substrate row driving unit.

Figure 3:
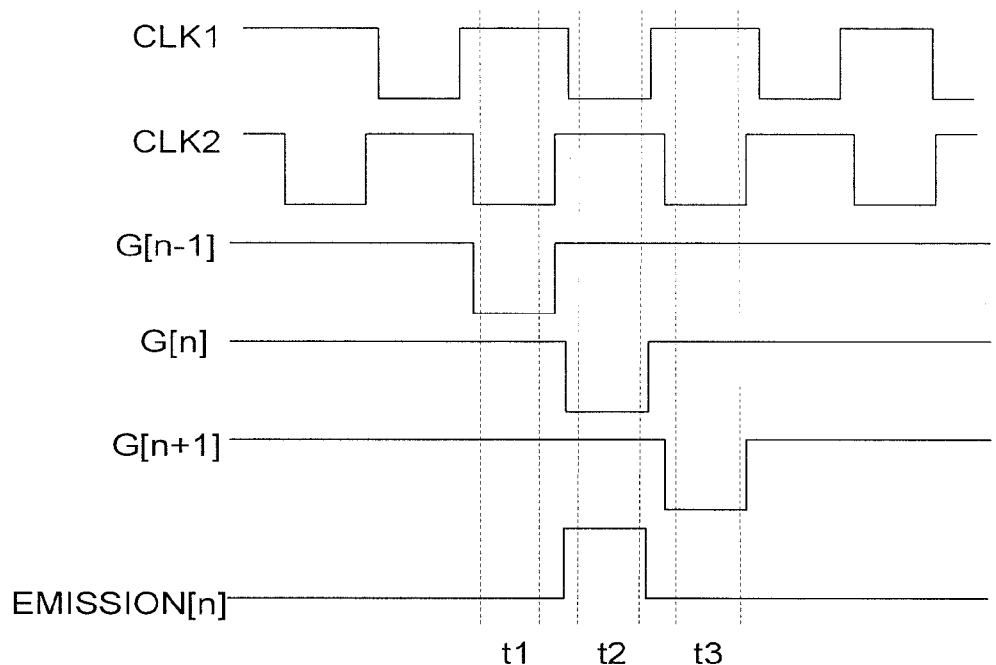
FIG. 3 is a timing chart of the respective signals of the array substrate row driving unit of the second embodiment of the present invention at work.

As shown in FIG. 3, the work process of the array substrate row driving unit according to the second embodiment of the present invention is divided into input sampling phase t1, signal output phase t2 and reset phase T3.

During the input sampling phase t1, G[n−1] is low and T1 is turned on, while G[n+1] is high and T2 is turned off, so in this case the potential at point N1 is correspondingly pulled down to VGL+|Vthp|. At this time CLK2 is low, T4 is turned off, and G[n] is high, so at this time C1 is being charged, and the input signal is sampled. At this time, G[n] and G [n+1] are both high, ensuring the working state of each transistor included in the control module will not change.

During the signal output phase t2, G[n−1] and G[n+1] are both high, and the potential at point N1 is maintained a VGL+|Vthp| by C1, which is a low-level, so T3 is turned on. At the same time, CLK2 is high, T4 is turned off and G[n] is low, so T6 and T8 are turned on. At this time, EMISSION[n] is high, used for lighting the organic light-emitting diode components.

During the reset phase t3, G [n−1] is high, ensuring that transistors T1 and T3 are turned off; CLK2 is low and T4 is turned on, so G[n] is pulled up to a high level; G[N] is high, ensuring that T6 and T8 are turned off, while G[n+1] is low, and the voltage at point N1 is pulled up again by turning on T2; T5 is turned on at the same time, and the potential at point N2 is pulled down to VGL+|Vthp|; T7 is turned on, and EMISSION[n] is correspondingly pulled down, thereby completing the reset operation of EMISSION[n];

wherein, Vthp being the threshold voltage of T1 and T5.

Figure 4:
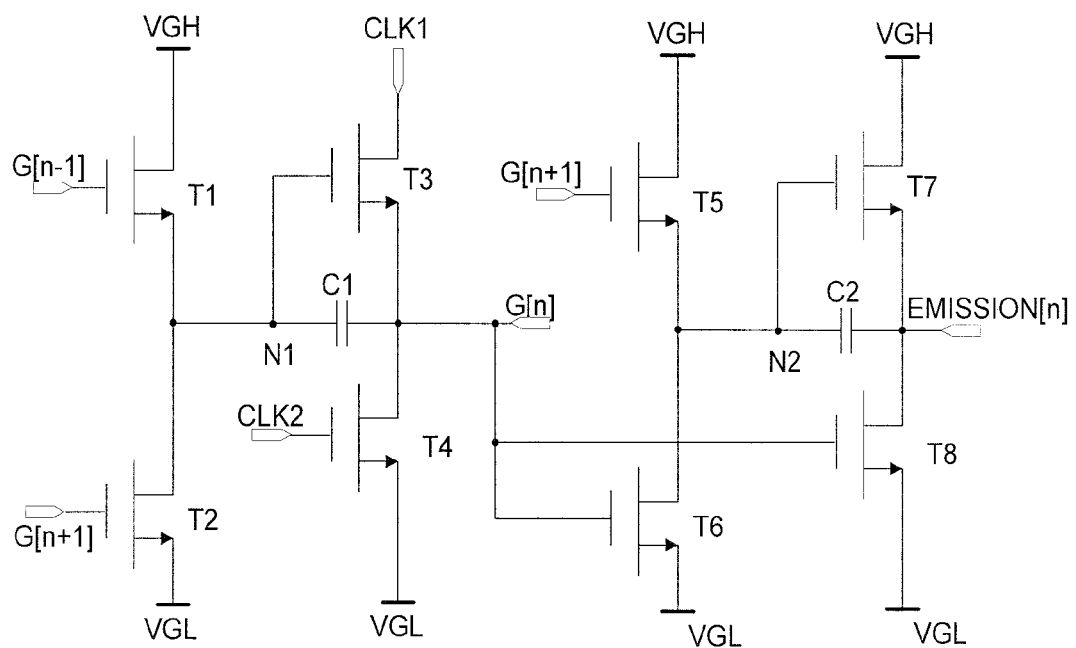
FIG. 4 is a circuit diagram of an array substrate row driving unit of a third embodiment of the present invention.

FIG. 4 shows the circuit diagram of the array substrate row driving unit according to a third embodiment of the present invention. The array substrate row driving unit according to the third embodiment of the present invention is based on that according to the first embodiment of the present invention. In the gate driving circuit unit according to the third embodiment of the present invention, the gate driving module comprises a first thin film transistor T1, a second thin film transistor T2, a third thin film transistor T3, a fourth thin film transistor T4 and a first bootstrap capacitor C1, wherein, the first thin film transistor T1, having a gate connected to the output for the gate driving signal of the previous-stage array substrate row driving unit, a source connected to a drain of the second thin film transistor T2, and a drain connected to the high-level output of the driving power supply;

the second thin film transistor T2, having a gate connected to the output for the gate driving signal of the next-stage array substrate row driving unit, and a source connected to the low-level output of the driving power supply;

the third thin film transistor T3, having a gate connected to the source of the first thin film transistor T1, a source connected to a drain of the fourth thin film transistor T4, and a drain connected to the input for a first clock signal;

the fourth thin film transistor T4, having a gate connected to the input for a second clock signal, and a source connected to the low-level output of the driving power supply;

the first bootstrap capacitor C1 being connected between the gate and source of the third thin film transistor T3;

the first thin film transistor T1, the second thin film transistor T2, the third thin film transistor T3 and the fourth thin film transistor T4 being n-type thin film transistors;

the emission control module comprising a fifth thin film transistor T5, a sixth fifth thin film transistor T6, a seventh thin film transistor T7, an eighth thin film transistor T8 and a second bootstrap capacitor C2, wherein, the fifth thin film transistor T5, having a gate connected to the output for the gate driving signal of the next-stage array substrate row driving unit, a source connected to a drain of the sixth thin film transistor T6, and a drain connected to the high-level output of the driving power supply;

the sixth thin film transistor T6 having a gate connected to the drain of the fourth thin film transistor T4, and a source connected to the low-level output of the driving power supply;

the seventh thin film transistor T7, having a gate connected to the source of the fifth thin film transistor T5, a source connected to a drain of the eighth thin film transistor T8, and a drain connected to the high-level output of the driving power supply;

the eighth thin film transistor T8, having a gate connected to the gate of the sixth thin film transistor T6, and a source connected to the low-level output of the driving power supply;

the second bootstrap capacitor C2 being connected between the gate and source of the seventh thin film transistor T7;

the fifth thin film transistor T5, the sixth thin film transistor T6, the seventh thin film transistor T7 and the eighth thin film transistor T8 being n-type thin film transistors; the gate of the first thin film transistor T1 being the input of the array substrate row driving unit according to the third embodiment of present invention, the gate of the second thin film transistor T2 being the reset terminal of the array substrate row driving unit according to the third embodiment of present invention, and the source of the third thin film transistor T3 being the output for the gate driving signal of the array substrate row driving unit according to the third embodiment of present invention; the source of the seventh thin film transistor T7 being the output for the emission control signal of the array substrate row driving unit according to the third embodiment of present invention;

wherein, output voltage of the low-level output of the driving power supply being VGL, and output voltage of the high-level output of the driving power supply being VGH; a first clock signal CLK1 being inputted into the first clock signal input, and a second clock signal CLK2 being inputted into the second clock signal input; the output signal of the output for the gate driving signal of the previous-stage array substrate row driving unit being G[n−1], that of the present-stage array substrate row driving unit being G[n], and that of the next-stage array substrate row driving unit being G[n+1]; the output signal of the output for the emission control signal of the present-stage array substrate row driving unit being EMISSION[n]; point N1 being a node connected to the gate of the third thin film transistor T3, and point N2 being a node connected to the gate of the seventh thin film transistor T7.

The array substrate row driving unit according to the third embodiment of the present invention is controlled by the first clock signal CLK1 and the second clock signal CLK2. The output signal of the output for the gate driving signal of the previous-stage array substrate row driving unit G[n−1] serves as the input signal of the present-stage array substrate row driving unit, and the output signal of the output for the gate driving signal of the next-stage array substrate row driving unit G[n+1] serves as the reset signal of the present-stage array substrate row driving unit.

Figure 5:
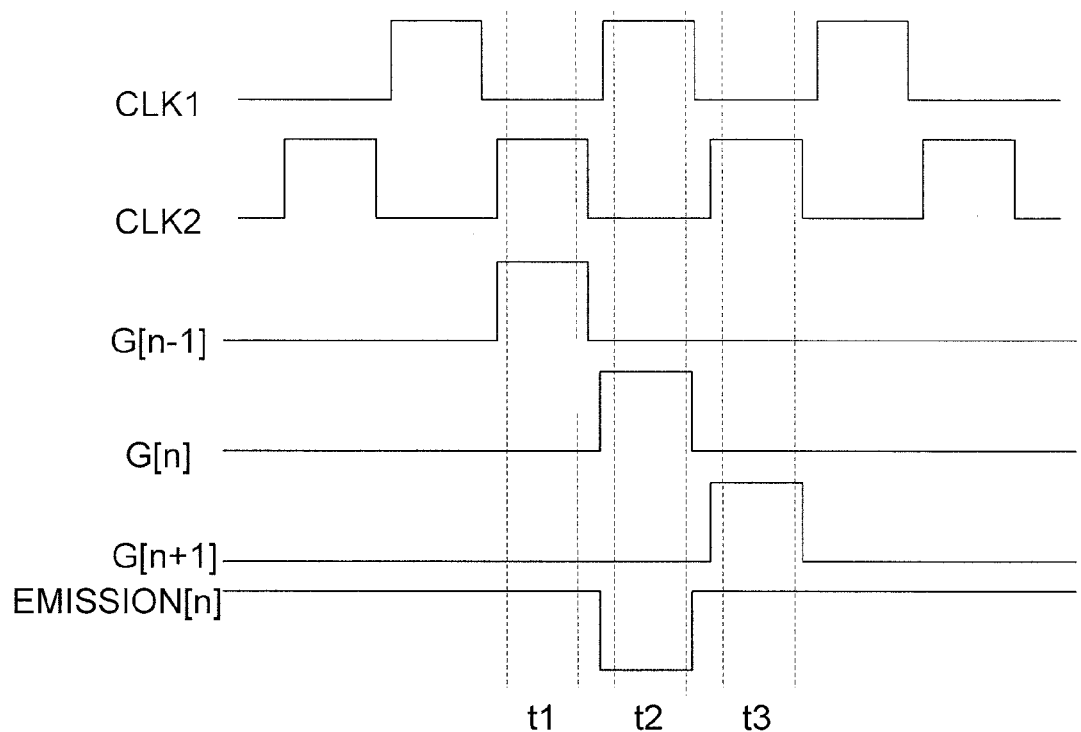
FIG. 5 is a timing chart of the respective signals of the array substrate row driving unit of the third embodiment of the present invention at work.

As shown in FIG. 5, the work process of the array substrate row driving unit according to the third embodiment of the present invention is divided into input sampling phase t1, signal output phase t2 and reset phase T3. The work process of the third embodiment of the present invention is similar to the second embodiment, and the related description will be omitted hereinafter.

The exemplary emission control module of the array substrate row driving unit according to the second and the third embodiment of the present invention are only by way of illustration, and have no limiting effect on the structure of the emission control module. Any control components that can generate, under control of the gate driving signal, an emission control signal which control the switching of the organic light-emitting diode and which has an opposite phase to that of the gate driving signal can all be used for constituting the emission control module.

An embodiment of the present invention also provides an array substrate row driving circuit, including multi-stages aforementioned array substrate row driving units manufactured on the array substrate of a liquid crystal through an array film-forming process.

Except for the first-stage array substrate row driving unit, the input of each stage of the array substrate row driving units is connected to the output for the gate driving signal of the previous-stage array substrate row driving unit;

Except for the final-stage array substrate row driving unit, the reset terminal of each stage of the array substrate row driving units is connected to the output for the gate driving signal of the next-stage array substrate row driving unit.

Figure 6:
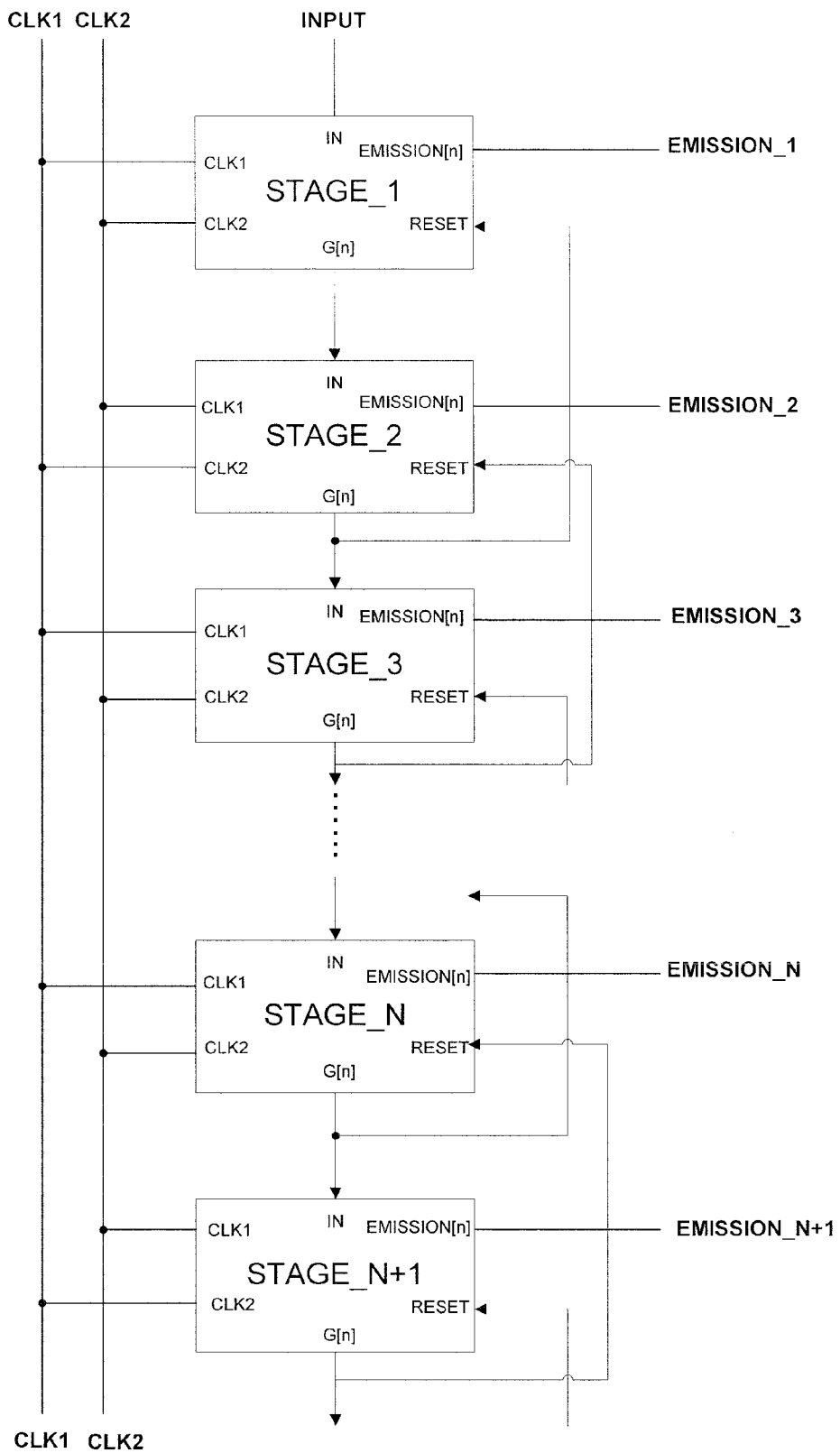
FIG. 6 is a circuit diagram of an array substrate row driving circuit of an embodiment of the present invention.

FIG. 6 shows an array substrate row driving circuit according to an embodiment of the present invention, comprising N+1 stages of array substrate row driving units, wherein N being a positive integer.

The input of the first-stage array substrate row driving unit is connected to the input signal INPUT.

Except for the first-stage array substrate row driving unit, the input of each stage of the array substrate row driving units IN is connected to the output for the gate driving signal of the previous-stage array substrate row driving unit.

Except for the final-stage array substrate row driving unit, the reset terminal of each stage of the array substrate row driving units RESET is connected to the output for the gate driving signal of the next-stage array substrate row driving unit.

In FIG. 6, EMISSION_1, EMISSION_2, EMISSION_3, EMISSION_N and EMISSION_N+1 indicate the output for the emission control signal of the first-stage array substrate row driving unit, the output for the emission control signal of the second-stage array substrate row driving unit, the output for the emission control signal of the third-stage array substrate row driving unit, the output for the emission control signal of the Nth-stage array substrate row driving unit and the output for the emission control signal of the N+1th-stage array substrate row driving unit respectively.

STAGE_1, STAGE_2, STAGE_3, STAGE_N and STAGE_N+1 indicate the first-stage array substrate row driving unit, the second-stage array substrate row driving unit, the third-stage array substrate row driving unit, the Nth-stage array substrate row driving unit and the N+1th-stage array substrate row driving unit.

An embodiment of the present invention also provides a display device, comprising the aforementioned array substrate row driving circuit.

The description above is only illustrative but not restrictive for the present invention, and the ordinary skilled in the art would understand that plenty of modifications, variations or equation can be made without departing from the spirit and scope defined by the appended claims, but they will all fall within the protection scope of the present invention.

What is claimed is:

1. An array substrate row driving unit, comprising a gate driving module for generating a gate driving signal, and the array substrate row driving unit further comprising an emission control module;

the emission control module, connected to an output for the gate driving signal of the gate driving module, for generating an emission control signal for controlling the switching of OLED under control of the gate driving signal, the gate driving signal having an opposite phase to that of the emission control signal;

wherein the emission control module comprises a fifth thin film transistor, a sixth thin film transistor, a seventh thin film transistor, an eighth thin film transistor and a second bootstrap capacitor; wherein, the fifth thin film transistor has a gate connected to the output for the gate driving signal of next-stage array substrate row driving unit, a source connected to a drain of the sixth thin film transistor, and a drain connected to a first level output of a driving power supply;

the sixth thin film transistor has a gate connected to the output for the gate driving signal of the gate driving module, and a source connected to a second level output of the driving power supply;

the seventh thin film transistor has a gate connected to the source of the fifth thin film transistor, a source connected to a drain of the eighth thin film transistor, and a drain connected to the first level output of the driving power supply;

the eighth thin film transistor has a gate connected to the gate of the sixth thin film transistor, and a source connected to the second level output of the driving power supply;

the second bootstrap capacitor is connected between the gate and source of the seventh thin film transistor;

the source of the seventh thin film transistor is an output for the emission control signal.

2. The array substrate row driving unit according to claim 1, wherein, the gate driving module comprising a first thin film transistor, a second thin film transistor, a third thin film transistor, a fourth thin film transistor and a first bootstrap capacitor, wherein, the first thin film transistor, having a gate connected to the output for the gate driving signal of the previous-stage array substrate row driving unit, a source connected to a drain of the second thin film transistor, and a drain connected to the first level output of the driving power supply;

the second thin film transistor, having a gate connected to the output for the gate driving signal of the next-stage array substrate row driving unit, and a source connected to the second level output of the driving power supply;

the third thin film transistor, having a gate connected to the source of the first thin film transistor, a source connected to a drain of the fourth thin film transistor, and a drain connected to the input for a first clock signal;

the fourth thin film transistor, having a gate connected to the input for a second clock signal, and a source connected to the second level output of the driving power supply;

the first bootstrap capacitor being connected between the gate and source of the third thin film transistor;

the gate of the first thin film transistor being an input, and the source of the third thin film transistor being the output for the present-stage gate driving signal.

3. The array substrate row driving unit according to claim 1, wherein, the first level output of the driving power supply being a low-level output;

the second level output of the driving power supply being a high-level output;

the first thin film transistor, the second thin film transistor, the third thin film transistor and the fourth thin film transistor being p-type thin film transistors.

4. The array substrate row driving unit according to claim 3, wherein, the first level output of the driving power supply being a low-level output;

the second level output of the driving power supply being a high-level output;

the fifth thin film transistor, the sixth thin film transistor, the seventh thin film transistor and the eighth thin film transistor being p-type thin film transistors.

5. The array substrate row driving unit according to claim 1, wherein, the first level output of the driving power supply being a high-level output;

the second level output of the driving power supply being a low-level output;

the first thin film transistor, the second thin film transistor, the third thin film transistor and the fourth thin film transistor being n-type thin film transistors.

6. The array substrate row driving unit according to claim 5, wherein, the first level output of the driving power supply being a high-level output;

the second level output of the driving power supply being a low-level output;

the fifth thin film transistor, the sixth thin film transistor, the seventh thin film transistor and the eighth thin film transistor being n-type thin film transistors.

7. An array substrate row driving circuit, including multi-stages array substrate row driving units manufactured on the array substrate of an organic light-emitting diode display through an array film-forming process;

except for the first-stage array substrate row driving unit, the input of each stage of the array substrate row driving units being connected to an output for the gate driving signal of the previous-stage array substrate row driving unit;

except for the final-stage array substrate row driving unit, the reset terminal of each stage of the array substrate row driving units being connected to the output for the gate driving signal of the next-stage array substrate row driving unit adjacent to the present-stage array substrate row driving unit;

wherein the array substrate row driving unit comprising a gate driving module for generating a gate driving signal, and the array substrate row driving unit further comprising an emission control module;

the emission control module, connected to the output for the gate driving signal of the gate driving module, for generating an emission control signal for controlling the switching of OLED under control of the gate driving signal, the gate driving signal having an opposite phase to that of the emission control signal;

wherein the emission control module comprises a fifth thin film transistor, a sixth thin film transistor, a seventh thin film transistor, an eighth thin film transistor and a second bootstrap capacitor; wherein, the fifth thin film transistor has a gate connected to the output for the gate driving signal of next-stage array substrate row driving unit, a source connected to a drain of the sixth thin film transistor, and a drain connected to a first level output of a driving power supply;

the sixth thin film transistor has a gate connected to the output for the gate driving signal of the gate driving module, and a source connected to a second level output of the driving power supply;

the seventh thin film transistor has a gate connected to the source of the fifth thin film transistor, a source connected to a drain of the eighth thin film transistor, and a drain connected to the first level output of the driving power supply;

the eighth thin film transistor has a gate connected to the gate of the sixth thin film transistor, and a source connected to the second level output of the driving power supply;

the second bootstrap capacitor is connected between the gate and source of the seventh thin film transistor;

the source of the seventh thin film transistor is an output for the emission control signal.

8. The array substrate row driving circuit according to claim 7, wherein the gate driving module comprising a first thin film transistor, a second thin film transistor, a third thin film transistor, a fourth thin film transistor and a first bootstrap capacitor, the first thin film transistor, having a gate connected to the output for the gate driving signal of the previous-stage array substrate row driving unit, a source connected to a drain of the second thin film transistor, and a drain connected to the first level output of the driving power supply;

the second thin film transistor, having a gate connected to the output for the gate driving signal of the next-stage array substrate row driving unit, and a source connected to the second level output of the driving power supply;

the third thin film transistor, having a gate connected to the source of the first thin film transistor, a source connected to a drain of the fourth thin film transistor, and a drain connected to the input for a first clock signal;

the fourth thin film transistor, having a gate connected to the input for a second clock signal, and a source connected to the second level output of the driving power supply;

the first bootstrap capacitor being connected between the gate and source of the third thin film transistor;

the gate of the first thin film transistor being an input, and the source of the third thin film transistor being the output for the present-stage gate driving signal.

9. The array substrate row driving circuit according to claim 7, wherein the first level output of the driving power supply being a low-level output;

the second level output of the driving power supply being a high-level output;

the first thin film transistor, the second thin film transistor, the third thin film transistor and the fourth thin film transistor being p-type thin film transistors.

10. The array substrate row driving circuit according to claim 7, wherein the first level output of the driving power supply being a low-level output;

the second level output of the driving power supply being a high-level output;

the fifth thin film transistor, the sixth thin film transistor, the seventh thin film transistor and the eighth thin film transistor being p-type thin film transistors.

11. The array substrate row driving circuit according to claim 7, wherein the first level output of the driving power supply being a high-level output;

the second level output of the driving power supply being a low-level output;

the first thin film transistor, the second thin film transistor, the third thin film transistor and the fourth thin film transistor being n-type thin film transistors.

12. The array substrate row driving circuit according to claim 7, wherein the first level output of the driving power supply being a high-level output;

the second level output of the driving power supply being a low-level output;

the fifth thin film transistor, the sixth thin film transistor, the seventh thin film transistor and the eighth thin film transistor being n-type thin film transistors.

13. A display device, comprising the array substrate row driving circuit including multi-stages array substrate row driving units manufactured on the array substrate of an organic light-emitting diode display through an array film-forming process;

except for the first-stage array substrate row driving unit, the input of each stage of the array substrate row driving units being connected to the output for the gate driving signal of the previous-stage array substrate row driving unit;

except for the final-stage array substrate row driving unit, the reset terminal of each stage of the array substrate row driving units being connected to the output for the gate driving signal of the next-stage array substrate row driving unit adjacent to the present-stage array substrate row driving unit;

wherein the array substrate row driving unit comprising an gate driving module for generating an gate driving signal, and the array substrate row driving unit further comprising an emission control module;

the emission control module, connected to the output for the gate driving signal of the gate driving module, for generating an emission control signal for controlling the switching of OLED under control of the gate driving signal, the gate driving signal having an opposite phase to that of the emission control signal;

wherein the emission control module comprises a fifth thin film transistor, a sixth thin film transistor, a seventh thin film transistor, an eighth thin film transistor and a second bootstrap capacitor; wherein, the fifth thin film transistor has a gate connected to the output for the gate driving signal of next-stage array substrate row driving unit, a source connected to a drain of the sixth thin film transistor, and a drain connected to a first level output of a driving power supply;

the sixth thin film transistor has a gate connected to the output for the gate driving signal of the gate driving module, and a source connected to a second level output of the driving power supply;

the seventh thin film transistor has a gate connected to the source of the fifth thin film transistor, a source connected to a drain of the eighth thin film transistor, and a drain connected to the first level output of the driving power supply;

the eighth thin film transistor has a gate connected to the gate of the sixth thin film transistor, and a source connected to the second level output of the driving power supply;

the second bootstrap capacitor is connected between the gate and source of the seventh thin film transistor;

the source of the seventh thin film transistor is an output for the emission control signal.

* * * * *